(12) United States Patent
Lee

(10) Patent No.: US 10,734,431 B2
(45) Date of Patent: Aug. 4, 2020

(54) IMAGE SENSOR

(71) Applicant: SK hynix Inc., Icheon-Si (KR)

(72) Inventor: Woong-Hee Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 81 days.

(21) Appl. No.: 15/877,898

(22) Filed: Jan. 23, 2018

(65) Prior Publication Data
US 2019/0027526 A1  Jan. 24, 2019

(30) Foreign Application Priority Data

Jul. 20, 2017 (KR) .................. 10-2017-0091847

(51) Int. Cl.
| | |
|---|---|
| H01L 27/146 | (2006.01) |
| H04N 5/365 | (2011.01) |
| H04N 5/378 | (2011.01) |
| H04N 5/3745 | (2011.01) |

(52) U.S. Cl.
CPC .. H01L 27/14641 (2013.01); H01L 27/14603 (2013.01); H01L 27/14636 (2013.01); H04N 5/365 (2013.01); H04N 5/378 (2013.01); H04N 5/37457 (2013.01)

(58) Field of Classification Search
CPC ......... H01L 27/14641; H01L 27/14603; H01L 27/14636; H04N 5/365; H04N 5/37457; H04N 5/378
USPC ....................................................... 348/294
See application file for complete search history.

(56) References Cited

U.S. PATENT DOCUMENTS

| 8,723,999 | B2 | 5/2014 | Kido et al. | |
|---|---|---|---|---|
| 9,165,959 | B2 | 10/2015 | Chen et al. | |
| 2008/0291310 | A1* | 11/2008 | Ladd ...................... | H04N 5/374 348/308 |
| 2009/0140304 | A1* | 6/2009 | Kudoh .............. | H01L 27/14603 257/292 |
| 2011/0128400 | A1* | 6/2011 | Wakano ............ | H01L 27/14609 348/222.1 |
| 2014/0239152 | A1* | 8/2014 | Chen ................. | H01L 27/14605 250/208.1 |

(Continued)

FOREIGN PATENT DOCUMENTS

| CN | 105359505 A | 2/2016 |
|---|---|---|
| CN | 205142377 U | 4/2016 |

(Continued)

*Primary Examiner* — Sinh Tran
*Assistant Examiner* — Zhenzhen Wu
(74) *Attorney, Agent, or Firm* — Perkins Coie LLP

(57) ABSTRACT

An image sensor includes a pixel array including pixel blocks, each comprising a light receiving section including unit pixels sharing a floating diffusion; and a driving section including a reset transistor and a driver transistor, wherein the pixel blocks include a first pixel block and a second pixel block which are adjacent to each other in a first direction, and a third pixel block and a fourth pixel block which are adjacent to the first pixel block and the second pixel block, respectively, in a second direction, and wherein the reset transistor of the first pixel block and the reset transistor of the second pixel block share a drain between the reset transistors, and the driver transistor of the third pixel block and the driver transistor of the fourth pixel block share a drain between the driver transistors.

20 Claims, 5 Drawing Sheets

(56) References Cited

U.S. PATENT DOCUMENTS

| | | | |
|---|---|---|---|
| 2015/0124139 A1* | 5/2015 | Ishiwata | H04N 5/37452 348/308 |
| 2016/0079290 A1* | 3/2016 | Yamakawa | H01L 27/14603 257/292 |
| 2016/0093653 A1* | 3/2016 | Tatani | H01L 27/14603 257/225 |
| 2018/0138229 A1 | 5/2018 | Lee | |
| 2018/0182804 A1* | 6/2018 | Lee | H01L 27/14641 |
| 2018/0227529 A1* | 8/2018 | Mo | H04N 5/3745 |
| 2019/0296087 A1* | 9/2019 | Keel | H01L 27/1461 |

FOREIGN PATENT DOCUMENTS

| | | |
|---|---|---|
| CN | 205508358 U | 8/2016 |
| CN | 106710516 A | 5/2017 |
| KR | 10-2018-0053916 | 5/2018 |

\* cited by examiner

IMAGE SENSOR

CROSS-REFERENCE TO RELATED APPLICATION

This patent document claims the priority and benefits of Korean Patent Application No. 10-2017-0091847 filed on Jul. 20, 2017 in the Korean Intellectual Property Office, the disclosure of which is incorporated herein by reference in its entirety.

TECHNICAL FIELD

Various embodiments generally relate to a semiconductor device fabrication technology, and more particularly, to an image sensor.

BACKGROUND

An image sensor is a device which receives light from an optical image or one or more objects and converts the received light into electrical signals forming an image. Recently, with the development of applications that use or are based on imaging from image sensors including the computer industry and communication industry, the demand for an image sensor having improved performance is increasing in various fields or applications, including, e.g., a digital camera, a camcorder, a portable device such as a personal communication system including a smart phone, a wearable device, a game machine, a security camera, a medical micro-camera and a robot.

SUMMARY

Various embodiments are directed to an image sensor with improved performance.

In an embodiment, an image sensor may include: a pixel array including a plurality of pixel blocks, each of the plurality of pixel blocks comprising: a light receiving section including a plurality of unit pixels which share a floating diffusion; and a driving section formed adjacent to the light receiving section, and including a reset transistor and a driver transistor, wherein the plurality of pixel blocks include a first pixel block and a second pixel block which are adjacent to each other in a first direction, and a third pixel block and a fourth pixel block which are adjacent to the first pixel block and the second pixel block, respectively, in a second direction intersecting with the first direction, and are further adjacent to each other in the first direction, and wherein the reset transistor of the driving section of the first pixel block and the reset transistor of the driving section of the second pixel block share a drain between the reset transistors, and the driver transistor of the driving section of the third pixel block and the driver transistor of the driving section of the fourth pixel block share a drain between the driver transistors.

In each of the plurality of pixel blocks, the driving section may include a first driving section which includes the reset transistor and a second driving section which is adjacent to the first driving section and includes the driver transistor, and may further includes a pickup region which is formed between the first driving section and the second driving section. The drain of the reset transistor and the drain of the driver transistor may be positioned at both ends, respectively, in each of the plurality of pixel blocks. The drain of the reset transistor which is shared by the first pixel block and the second pixel block and the drain of the driver transistor which is shared by the third pixel block and the fourth pixel block may be positioned on the same line in the second direction. A reset voltage may be applied to the drain of the reset transistor which is shared by the first pixel block and the second pixel block, a driver voltage may be applied to the drain of the driver transistor which is shared by the third pixel block and the fourth pixel block, and the reset voltage and the driver voltage are a power supply voltage or a positive voltage equal to or larger than the power supply voltage. The plurality of pixel blocks include pixel blocks positioned on oblique lines crossing the first pixel block and may have the same planar shape as the first pixel block. The plurality of pixel blocks include pixel blocks positioned on oblique lines crossing the second pixel block and may have the same planar shape as the second pixel block. The planar shape of the first pixel block may be the same as the planar shape of the fourth pixel block, and the planar shape of the second pixel block may be the same as the planar shape of the third pixel block. A drain of the reset transistor may be located further away from a center of a corresponding pixel block than a source of the reset transistor is, and wherein a drain of the driver transistor may be located further away from the center of the corresponding pixel block than a source of the driver transistor is.

In an embodiment, an image sensor may include: a pixel array including a plurality of pixel blocks, each of the plurality of pixel blocks comprising: a light receiving section including a plurality of unit pixels which share a floating diffusion; a driving section formed adjacent to the light receiving section, and including a reset transistor and a driver transistor; and an intercoupling section including a first conductive region which electrically couples the floating diffusion with the reset transistor and the driver transistor, and a second conductive region which has a shape symmetrical to the first conductive region based on the floating diffusion and is not electrically coupled to the reset transistor and the driver transistor, wherein the plurality of pixel blocks include a first pixel block and a second pixel block which are adjacent to each other in a first direction, and a third pixel block and a fourth pixel block which are adjacent to the first pixel block and the second pixel block, respectively, in a second direction intersecting with the first direction, and are further adjacent to each other in the first direction, and wherein the reset transistor of the driving section of the first pixel block and the reset transistor of the driving section of the second pixel block share a drain between the reset transistors, and the driver transistor of the driving section of the third pixel block and the driver transistor of the driving section of the fourth pixel block share a drain between the driver transistors.

In each of the plurality of pixel blocks, the driving section may include a first driving section which includes the reset transistor and a second driving section which is adjacent to the first driving section and includes the driver transistor, and may further include a pickup region which is formed between the first driving section and the second driving section. The second driving section may further include a selection transistor, and wherein the selection transistor may be located closer to the floating diffusion than the driver transistor. A gate of the selection transistor may be positioned on the same line as the floating diffusion.

The first conductive region of the intercoupling section electrically couples the floating diffusion and a source of the reset transistor and electrically couples the floating diffusion and a gate of the driver transistor. A distance between the floating diffusion and the source of the reset transistor may be substantially the same as a distance between the floating diffusion and the gate of the driver transistor.

Areas over which the intercoupling section overlaps with the respective unit pixels may be substantially the same one another. The drain of the reset transistor and the drain of the driver transistor may be positioned at both ends, respectively, in each of the plurality of pixel blocks. The drain of the reset transistor which is shared by the first pixel block and the second pixel block and the drain of the driver transistor which is shared by the third pixel block and the fourth pixel block may be positioned on the same line in the second direction. A reset voltage may be applied to the drain of the reset transistor which is shared by the first pixel block and the second pixel block, a driver voltage may be applied to the drain of the driver transistor which is shared by the third pixel block and the fourth pixel block, and the reset voltage and the driver voltage are a power supply voltage or a positive voltage equal to or larger than the power supply voltage. The plurality of pixel blocks include pixel blocks positioned on oblique lines crossing the first pixel block and may have the same planar shape as the first pixel block. The plurality of pixel blocks include pixel blocks positioned on oblique lines crossing the second pixel block and may have the same planar shape as the second pixel block. The planar shape of the first pixel block may be the same as the planar shape of the fourth pixel block, and the planar shape of the second pixel block may be the same as the planar shape of the third pixel block.

In another aspect, an image sensor is provided to comprise a pixel array including pixel blocks, each pixel block including: a light receiving circuit including a floating diffusion and unit pixels surrounding the floating diffusion, the unit pixels generating photocharges that are received by the floating diffusion; a driving circuit electrically coupled to the light receiving circuit to include a reset transistor electrically coupled to the floating diffusion to reset photocharges in the floating region and a driver transistor to supply a driver signal to the light receiving circuit, wherein a drain of the reset transistor is located further away from a center of a corresponding pixel block than a source of the reset transistor is, and wherein a drain of the driver transistor is located further away from the center of the corresponding pixel block than a source of the driver transistor is.

In some implementations, the driving circuit further includes a select transistor coupled to select the corresponding pixel block for being read out the photocharges in the floating region. In some implementations, the select transistor and the floating diffusion are arranged on a same line. In some implementations, the image sensor further comprises an intercoupling circuit electrically coupling the light receiving circuit and the driving circuit, wherein the intercoupling circuit includes a first contact electrically coupled to the floating diffusion, a second contact electrically coupled the reset transistor, and a third contact electrically coupled to the driver transistor. In some implementations, a distance between the first contact and the second contact is equal to a distance between the first contact and the third contact. In some implementations, the intercoupling circuit has a symmetrical shape with respect to the first contact. In some implementations, two of adjacent pixel blocks share a diffusion region between two transistors that are respectively located in the two pixel blocks. In some implementations, the shared diffusion region includes a transistor drain.

According to the embodiments, since a plurality of pixel blocks having shapes which share the drains of reset transistors and a plurality of pixel blocks having shapes which share the drains of driver transistors are alternately disposed in one direction, it is possible to prevent noise generation and characteristic deterioration due to a shared pixel structure.

DETAILED DESCRIPTION

The disclosed image sensing technology can be implemented to provide an electronic device including an image sensor to prevent noise generation and characteristic deterioration due to a shared pixel structure.

The following embodiment is to provide an image sensor with improved performance. In some implementations, an image sensor may have a shared pixel structure to improve the degree of integration. One embodiment of the disclosed technology is to provide an image sensor capable of preventing characteristic deterioration due to noise generated by a shared pixel structure. For reference, the noise generated by a shared pixel structure may include a temporal noise which is a temporal variation in the pixel output at a fixed incident light level and a fixed pattern noise (FPN) which is a undesired spatial pattern produced by the array of imaging pixels that is superimposed over a captured image. The temporal noise is a noise may occur due to a reduction in the size of a pixel transistor, in particular, a reduction in the area of a channel, by an increase in the degree of integration of an image sensor. Around the unit pixels sharing a floating diffusion, various types and shapes of structures, for example, conductive lines and pixel transistors, are disposed, which result in differences in overlap capacitance and/or parasitic capacitance of the unit pixels. The fixed pattern noise may occur due to such differences in overlap capacitance and/or parasitic capacitance.

The disclosed technology provide various implementations of an image sensor having a shared pixel structure, which can prevent characteristic deterioration due to temporal noise and fixed pattern noise. In some implementations, an image sensor includes a first group of pixel blocks having shapes sharing a drain of reset transistors and a second group of pixel blocks having shapes sharing a drain of driver transistors that are alternately disposed in one direction.

In the example of an embodiment of the disclosed technology to be described below, four different directions D1, D2, D3 and D4 are referenced for convenience: a first direction D1 represents a horizontal direction, a left-right direction or a row direction, and a second direction D2 represents a vertical direction, a column direction or an up-down direction and a third direction D3 and a fourth direction D4 intersecting with each other may be oblique directions based on D1 and D2. While it is illustrated in the example of the disclosed embodiment that the first direction D1 and the second direction D2 are a row direction and a column direction, respectively, it is to be noted that implementations of the disclosed technology are not limited thereto. For example, in another implementation, the first direction D1 may be a column direction, and the second direction D2 may be a row direction.

Figure 1:
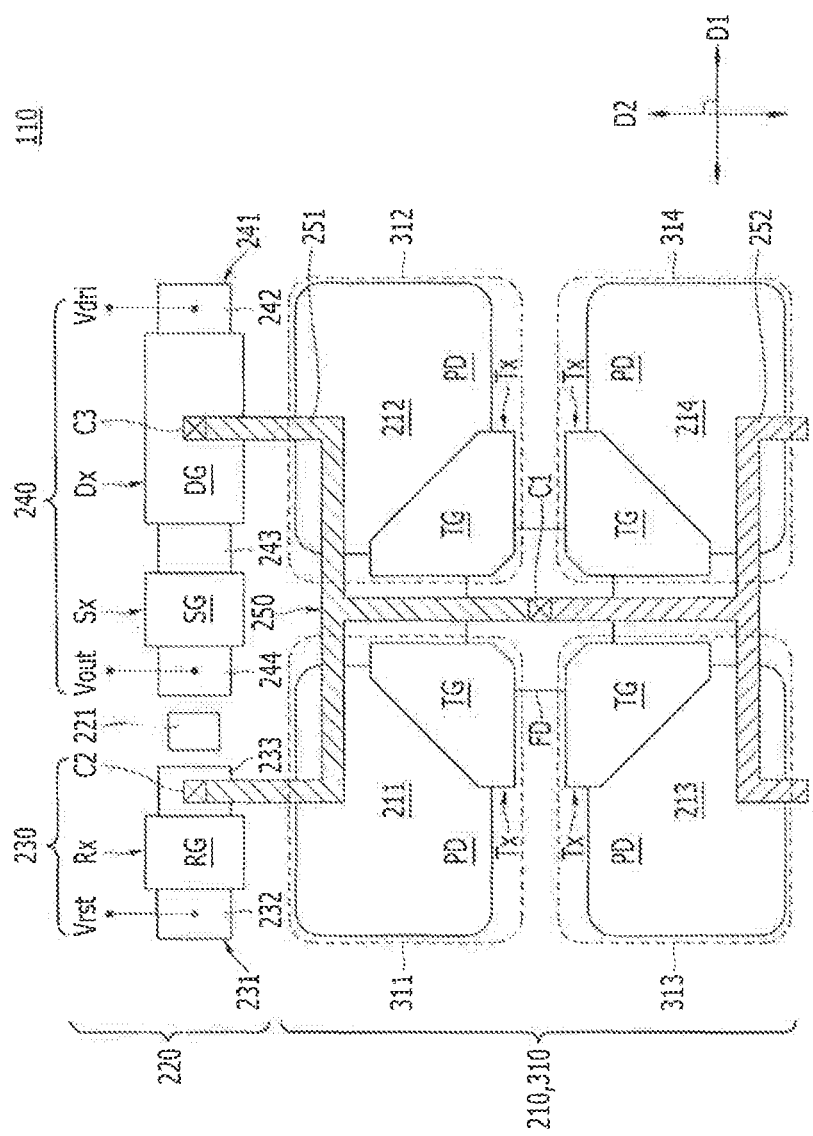
FIG. 1 is a top view illustrating a representation of an example of a pixel block of an image sensor and a color pattern corresponding to the pixel block based on an embodiment of the disclosed technology.
Figure 2:
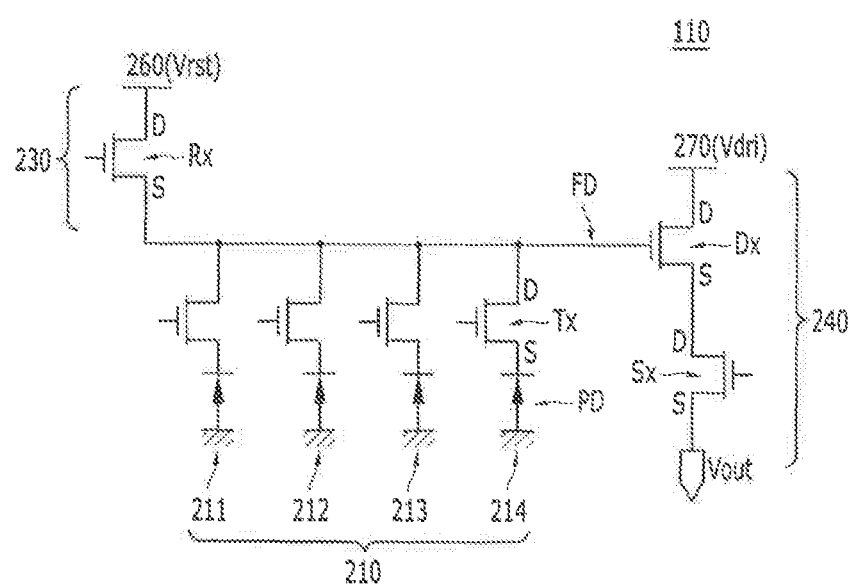
FIG. 2 is an equivalent circuit diagram corresponding to the pixel block of the image sensor based on an embodiment of the disclosed technology.

FIG. 1 is a top view illustrating a representation of an example of a pixel block of an image sensor and a color pattern corresponding to the pixel block in accordance with an embodiment. FIG. 2 is an equivalent circuit diagram corresponding to the pixel block of the image sensor in accordance with the embodiment.

As shown in FIGS. 1 and 2, the image sensor in accordance with the embodiment may include a pixel block 110 which has a shared pixel structure. The pixel block 110 may include a light receiving section 210 which generates photocharges in response to incident light, a driving section 220 which generates and outputs an output signal Vout corresponding to the photocharges generated by the light receiving section 210, and an intercoupling section 250 which electrically couples the light receiving section 210 and the driving section 220. While it is illustrated in the example of the present embodiment that the pixel block 110 includes one light receiving section 210 and one driving section 220, it is to be noted that implementations of the disclosed technology are not limited thereto. As an example of a modification to the illustrated example, the pixel block 110 may include at least two light receiving sections 210 which may share one driving section 220. Also, as an example of another modification, the pixel block 110 may include at least two light receiving sections 210 and at least two driving sections 220, and the at least two light receiving sections 210 may share the at least two driving sections 220. Therefore, the number of light receiving sections 210, the number of driving sections 220 and the number of in the pixel block 110 can be designed in various manners.

In the pixel block 110 of the image sensor in accordance with the embodiment, each light receiving section 210 may include a plurality of unit pixels in rows and columns which are arranged in an m×n (m and n are natural numbers) matrix structure and share a floating diffusion FD amongst the unit pixels. For example, the light receiving section 210 may be or have a 4-shared pixel structure which includes four unit pixels 211 to 214, that is, a first unit pixel 211 to a fourth unit pixel 214, arranged in a 2×2 matrix structure. While it is illustrated in this specific example of the embodiment that the light receiving section 210 has a 4-shared pixel structure, it is to be noted that is the implementations of the embodiment are not limited thereto. As an example of a modification, the light receiving section 210 may have a 2^n (n is a natural number)-shared pixel structure.

In the light receiving section 210, the floating diffusion FD may be positioned at the center of the unit pixels that share the FD, and the first unit pixel 211 to the fourth unit pixel 214 may be disposed to surround the floating diffusion FD. In some implementations of the light receiving section 210, the first unit pixel 211, the second unit pixel 212, the third unit pixel 213 and the fourth unit pixel 214 may be positioned in a symmetric pattern around the floating diffusion FD, e.g., at a left upper end, a right upper end, a left lower end and a right lower end, respectively. Each of the first unit pixel 211 to the fourth unit pixel 214 may include a photoelectric conversion element PD which generates photocharges in response to incident light and a transfer transistor Tx which is coupled to the PD and transfers the photocharges generated in the photoelectric conversion element PD to the floating diffusion FD in response to a transfer signal applied to the transfer transistor Tx with a transfer gate, a source and a drain. The photoelectric conversion element PD may be implemented in various configurations, including a photodiode, a phototransistor, a photogate, a pinned photodiode (PPD), or one or more combinations thereof. For example, the photoelectric conversion element PD may include organic or/and inorganic photodiodes. In some implementations, the photoelectric conversion element PD may be configured by any one of organic and inorganic photodiodes or may be configured in a form in which an organic photodiode and an inorganic photodiode are stacked. The transfer signal may be applied to a transfer gate TG of the transfer transistor Tx, and the photoelectric conversion element PD and the floating diffusion FD may serve as a source S and a drain D, respectively, of the transfer transistor Tx.

In the pixel block 110 of the image sensor in accordance with the embodiment, the driving section 220 may be positioned at one side of the light receiving section 210. For example, one side of the light receiving section 210 may be the top end of the light receiving section 210 as shown in FIG. 1. The location of the driving section 220 may be placed at other locations and is not limited to the top of the light receiving section 210. For example, the driving section may be positioned on the right side of the light receiving section 210.

The driving section 220 may include a first driving section 230 which includes a reset transistor Rx, a second driving section 240 which is adjacent to the first driving section 230 and includes a driver transistor Dx, and a pickup region 221. For reference, while it is illustrated in FIG. 1 for the sake of convenience of explanation that the second driving section 240 is positioned at the right side of the first driving section 230, it is to be noted that the second driving section 240 may be positioned at the left side of the first driving section 230 (see FIG. 3).

The first driving section 230 may include a reset transistor Rx. The reset transistor Rx may initialize the floating diffusion FD by removing the photo-generated charges after a readout operation and the photoelectric conversion element PD of the light receiving section 210 in response to a reset signal applied to the reset transistor Rx. The reset transistor Rx may include a first active region 231, a reset gate RG which is formed on the first active region 231, and a first junction region 232 and a second junction region 233 which are formed in the first active region 231 at both sides of the reset gate RG. The first active region 231 may have a bar type shape which has a major axis and a minor axis and in which the major axis extends in the first direction D1. The reset signal may be applied to the reset gate RG. The first junction region 232 may operate as a drain D of the reset transistor Rx. The first junction region 232 provides the reset transistor Rx with a reset voltage Vrst and the first junction region 232 may be coupled to a reset voltage supply node 260 which supplies the reset voltage Vrst. The reset voltage Vrst may be a positive voltage. For example, the reset voltage Vrst may be a power supply voltage (VDD) or a positive voltage larger than the power supply voltage (VDD). The second junction region 233 may operate as a source S of the reset transistor Rx. The second junction region 233 may be electrically coupled with the intercoupling section 250 through a second contact C2. The second junction region 233 may be electrically coupled with the floating diffusion FD of the light receiving section 210 through the intercoupling section 250.

In the pixel block 110, the first junction region 232 which is part of the reset transistor Rx and is applied with the reset voltage Vrst may be positioned the outermost based on the center of pixel block 110 such as the center of the shared floating diffusion FD. Under this configuration, the drain D of the reset transistor Rx may be positioned the outermost in the pixel block 110. This is to ensure that, in a pixel array 100 in which a plurality of pixel blocks 110 are arranged, adjacent pixel blocks 110 are located based on one another to easily share a first junction region 232 (see FIG. 3). In this way, as adjacent pixel blocks 110 share a first junction region 232, it is possible to increase the size of pixel transistors, in particular, the channel area of pixel transistors, within a limited area. Through this arrangement with an increased pixel transistor size due to the sharing design, the characteristics of pixel transistors may be improved, and characteristic dispersions due to process variations may be reduced. As a result, it is possible to effectively prevent or reduce the generation of the temporal noise.

The second driving section 240 may generate the output signal Vout corresponding to the photocharges generated by the light receiving section 210, and output the output signal Vout to a column line (not shown) in response to a select signal applied through a row line (not shown). To this end, the second driving section 240 may include the driver transistor Dx and a selection transistor Sx. The driver transistor Dx may generate the output signal Vout corresponding to the amount of photocharges generated by the light receiving section 210. The selection transistor Sx output the output signal Vout to a column line in response to a select signal applied through a row line. The select signal may be applied to the gate of the selection transistor Sx.

The driver transistor Dx and the selection transistor Sx of the second driving section 240 may share a second active region 241 and may include a driver gate DG and a selection gate SG, respectively, which are formed on the second active region 241. The second active region 241 may have a bar type shape which has a major axis and a minor axis and in which the major axis extends in the first direction D1. The driver gate DG may have a size larger than the reset gate RG and the selection gate SG to improve a noise characteristic. Under this configuration, the channel area of the driver transistor Dx may be larger than the reset transistor Rx and the selection transistor Sx. The driver gate DG may be electrically coupled with the floating diffusion FD through the intercoupling section 250. The row line may be coupled to the selection gate SG. Junction regions may be formed in the second active region 241 at both sides of the driver gate DG and the selection gate SG. A third junction region 242 may be formed in the second active region 241 at one side of the driver gate DG. A fourth junction region 243 may be formed in the second active region 241 at another side of the driver gate DG, for example, between the driver gate DG and the selection gate SG. A fifth junction region 244 may be formed in the second active region 241 at another side, for example, an opposite side, of the selection gate SG.

The third junction region 242 may be or operate as a drain D of the driver transistor Dx. The driver transistor Dx may be applied with a driver voltage Vdri through the third junction region 242. The third junction region 242 may be coupled to a driver voltage supply node 270. The driver voltage Vdri may be a positive voltage. For example, the driver voltage Vdri may be the power supply voltage (VDD) or a positive voltage greater than the power supply voltage (VDD). The fourth junction region 243 may be or operate as a source S of the driver transistor Dx and a drain D of the selection transistor Sx. The fifth junction region 244 may be or operate as a source S of the selection transistor Sx. The fifth junction region 244 may be coupled to the column line, and the output signal Vout may be transferred to the column line through the fifth junction region 244.

In the pixel block 110, the third junction region 242 which is applied with the driver voltage Vdri may be positioned the outermost based on the center of the pixel block 110. For example, the third junction region 242 is positioned closest to an outside boundary of the pixel block 110 as compared to the fourth and fifth junction regions 243 and 244. In some implementations, the drain D of the driver transistor Dx may be positioned outermost in the pixel block 110. Since the fifth junction region 244 operates as the source S of the driver transistor Dx, the drain D of the driver transistor Dx is located further away from a center of pixel block 110 than a source S of the driver transistor Dx. This is to ensure that, in the pixel array 100 in which the plurality of pixel blocks 110 are arranged, adjacent pixel blocks 110 easily share a third junction region 242 (see FIG. 3). In this way, as adjacent pixel blocks 110 share a third junction region 242, it is possible to increase the size of pixel transistors, in particular, the channel area of pixel transistors, within a limited area. Through this arrangement with an increased pixel transistor size due to the sharing design, it is possible to effectively prevent or reduce the generation of the temporal noise. For reference, in the pixel block 110, the drain D of the reset transistor Rx and the drain D of the driver transistor Dx may be positioned at both sides, respectively, of the pixel block 110. In some implementations, the drain D of the resent transistor Rx and the drain D of the driver transistor Dx are positioned at opposite sides of the pixel block to face each other.

In the pixel block 110, the driver transistor Dx may be positioned further outside than the selection transistor Sx, and the selection gate SG may be positioned on the same line as the floating diffusion FD. In some implementations, the selection gate SG may be distanced as same as the floating diffusion FD from the outside boundary of the pixel block. In some implementations, the selection gate SG and the floating diffusion FD are arranged along the second direction D2. This is to minimize the interference due to the bias applied to the selection gate SG. For example, this is to minimize the interference between the selection gate SG and the plurality of unit pixels 211 to 214.

While it is illustrated in the embodiment that the second driving section 240 is configured by the driver transistor Dx and the selection transistor Sx, it is to be noted that the present disclosure is not limited thereto. As a modification, the second driving section 240 may be configured by only the driver transistor Dx.

The pickup region 221 is to provide reference potential for the pixel block 110. For example, a predetermined voltage, for example, a ground voltage (VSS), may be applied to a substrate which is formed with the pixel block 110, through the pickup region 221. As the reference potential, for example, the ground voltage, is provided to the pixel block 110 through the pickup region 221, the operational stability of the pixel block 110 may be improved. In order to effectively improve the operational stability of the pixel block 110, the pickup region 221 may be formed to be adjacent to the source S of the selection transistor Sx, for example, the fifth junction region 244 which is coupled with the column line. This is to prevent a variation from occurring in the output signal Vout by electric field effect or interference due to structures adjacent to the fifth junction region 244. Therefore, the pickup region 221 may be positioned between the first driving section 230 and the second driving section 240.

The intercoupling section 250 may play the role of electrically coupling the light receiving section 210 and the first driving section 230 and electrically coupling the light receiving section 210 and the second driving section 240. Thus, the intercoupling section 250 may include conductive lines. In FIG. 1, the intercoupling section 250 includes first to third contacts C1, C2 and C3. In some implementations, the intercoupling section 250 may be electrically coupled with the floating diffusion FD of the light receiving section 210 through a first contact C1. The intercoupling section 250 may be electrically coupled to the source S of the reset transistor Rx of the first driving section 230, for example, the second junction region 233, through the second contact C2. Furthermore, the intercoupling section 250 may be electrically coupled with the driver gate DG of the second driving section 240 through a third contact C3.

In the intercoupling section 250, the distance between the first contact C1 and the second contact C2 may be substantially the same as the distance between the first contact C1 and the third contact C3. Thus, an area in which the intercoupling section 250 and the first unit pixel 211 overlap has the same size as an area in which the intercoupling section 250 and the second unit pixel 212 overlap. That is to say, this is to make the overlap capacitance between the intercoupling section 250 and the first unit pixel 211 substantially the same as the overlap capacitance between the intercoupling section 250 and the second unit pixel 212. Through this, fixed pattern noise generation and characteristic deterioration may be prevented.

The intercoupling section 250 may include a first conductive region 251 and a second conductive region 252 which are positioned at different sides of the first contact C1 by which the intercoupling section 250 is coupled with the floating diffusion FD. The second conductive region 252 For example, the first conductive region 251 and the second conductive region 252 are positioned at opposite sides of the first contact C1 along the second direction D2. The first conductive region 251 couples the light receiving section 210 with the first driving section 230 and the second driving section 240 of the driving section 220 for operating the pixel block via the reset signal Vrst and the drive signal Vdri and the second conductive region 252 is not coupled to the driving section 220 but operates to balance the overlap capacitances between the respective unit pixels 211 to 214 and the intercoupling section 250. The second conductive region 252 may have a shape symmetrical to the conductive region 251 in the second direction D2 based on the first contact C1 or the floating diffusion FD. Therefore, areas over which the intercoupling section 250 and the respective unit pixels 211 to 214 overlap with each other may be substantially the same. Under this design, the overlap capacitances induced between the intercoupling section 250 and the plurality of unit pixels 211 to 214 may be substantially the same. Through this arrangement, the fixed pattern noise generation and characteristic deterioration may be effectively prevented or reduced.

The image sensor in accordance with the embodiment may include a color pattern 310 corresponding to the pixel block 110. The color pattern 310 may include a plurality of color filters 311 to 314 corresponding to the unit pixels 211 to 214, respectively, of the pixel block 110. For reference, in FIG. 1, the plurality of color filters 311 to 314 are illustrated by dotted lines. Each of the plurality of color filters 311 to 314 may be configured to include any one or two more of a red filter, a green filter, a blue filter, a cyan filter, a yellow filter, a magenta filter, a white filter, a black filter, an IR cutoff filter, an IR pass filter, or a band pass filter which passes a specific wavelength band. In some implementations, the color filter may operate as a single filter or a multi-filter. For example, the color pattern 310 may include a first color filter 311 to a fourth color filter 314 corresponding to the first unit pixel 211 to the fourth unit pixel 214, respectively. In some implementations, the color pattern 310 may be configured as a Bayer pattern in which the first color filter 311 and the fourth color filter 314 are green filters, and the second color filter 312 and the third color filter 313 are a red filter and a blue filter, respectively.

Although not shown in the drawing, in order to prevent characteristic deterioration due to fixed pattern noise, in some implementations, all of the first color filter 311 to the fourth color filter 314 may have the same color. Also, as an example of a modification, the first color filter 311 and the second color filter 312 which are adjacent in the first direction D1 may have the same color, and the third color filter 313 and the fourth color filter 314 which are adjacent in the first direction D1 may have the same color. In this regard, the first color filter 311 and the third color filter 313 may have different colors. As an example for another modification, the first color filter 311 and the third color filter 313 which are adjacent in the second direction D2 may have the same color, and the second color filter 312 and the fourth color filter 314 which are adjacent in the second direction D2 may have the same color. In this regard, the first color filter 311 and the second color filter 312 may have different colors.

Hereinbelow, the disposition of pixel blocks 110 each including the pixel block 110 in accordance with the embodiment and capable of effectively preventing noise generation and characteristic deterioration due to a shared pixel structure is described in detail with reference to drawings.

Figure 3:
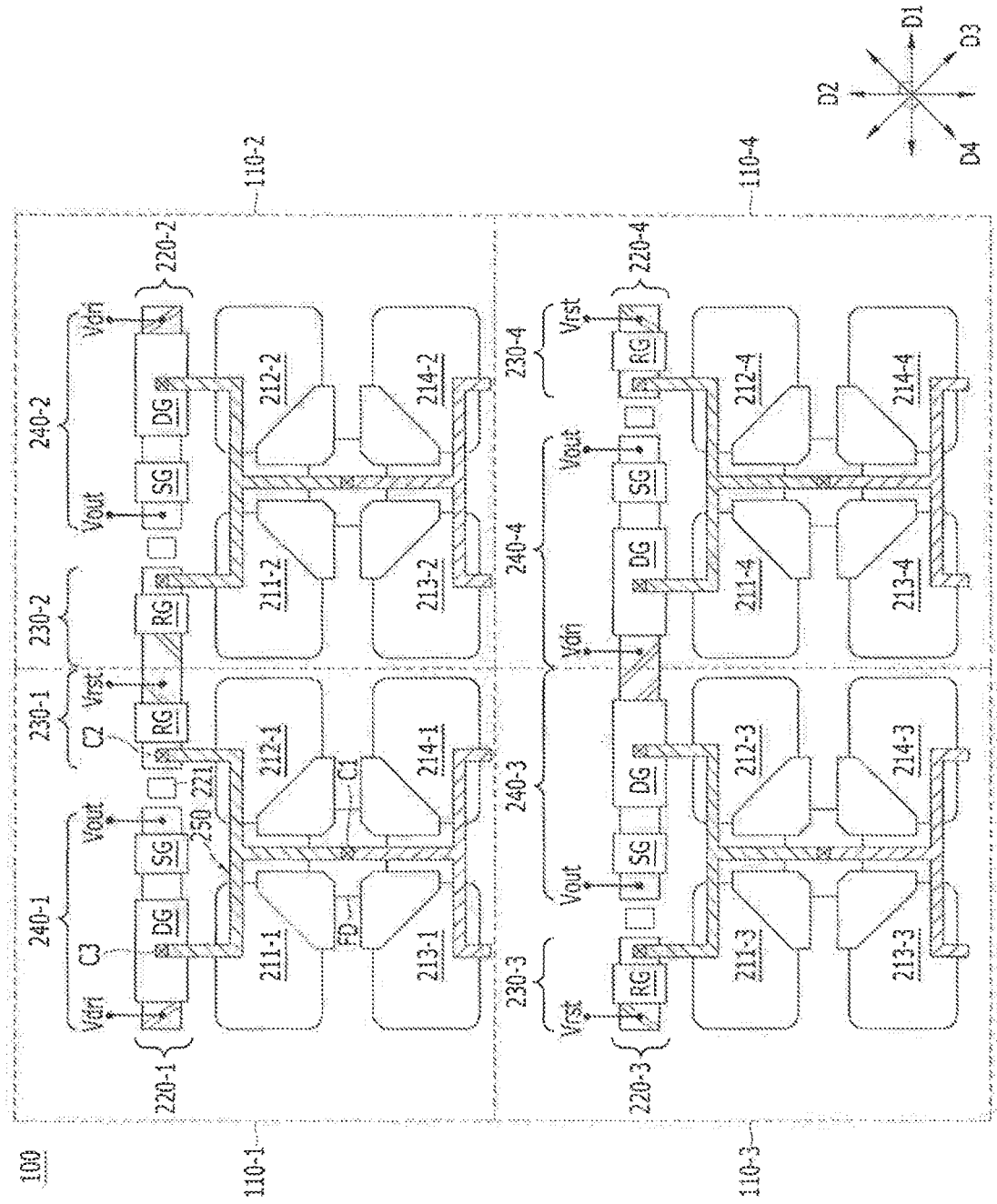
FIG. 3 is a top view illustrating a representation of an example of a portion of a pixel array of an image sensor based on an embodiment of the disclosed technology.

FIG. 3 is a top view illustrating a representation of an example of a portion of a pixel array of an image sensor in accordance with an embodiment a pixel design in FIG. 1.

Referring to FIGS. 1 to 3, the image sensor in accordance with the embodiment may include a pixel array 100 in which a plurality of pixel blocks 110-1 to 110-4 are arranged in a matrix structure. Each of the plurality of pixel blocks 110-1 to 110-4 may have a shared pixel structure. Each of the plurality of pixel blocks 110-1 to 110-4 may include a light receiving section 210 which generates photocharges in response to incident light, a driving section 220 which generates and outputs an output signal Vout corresponding to the photocharges generated by the light receiving section 210, and an intercoupling section 250 which electrically couples the light receiving section 210 and the driving section 220. The driving section 220 may include a first driving section 230 which includes a reset transistor Rx and a second driving section 240 which includes a driver transistor Dx. Since detailed descriptions for each pixel block 110 were made above with reference to FIGS. 1 and 2, further descriptions thereof are omitted herein.

The pixel array 100 of the image sensor in accordance with the embodiment are arranged such that any one pixel block is disposed adjacent any other pixel array in the first direction D1 and/or the second direction D2. For example, a first pixel block 110-1 may be disposed adjacent to a second pixel block 110-2 in the first direction D1. Further, the first pixel block 110-1 and the second pixel block 110-2 may be disposed adjacent to a third pixel block 110-3 and a fourth pixel block 110-4, respectively, in the second direction D2.

The pixel blocks 110 which are positioned on the same lines in the third direction D3 and the fourth direction D4 may have the same planar shape to each other. For example, the first pixel block 110-1 and the fourth pixel block 110-4 are positioned on the same line in the third direction D3. Thus, the planar shape of the first pixel block 110-1 may be the same as the planar shape of the fourth pixel block 110-4. Also, the second pixel block 110-2 and the third pixel block 110-3 are positioned on the same line in the fourth direction D4. Thus, the planar shape of the second pixel block 110-2 may be the same as the planar shape of the third pixel block 110-3. The pixel blocks 110 which are positioned on the same line in the first direction D1 or the second direction D2 may have different shapes from each other. For example, the first pixel block 110-1 and the second pixel block 110-2, which are positioned on the same line in the first direction, have different shapes from each other and the first pixel block 110-1 and the third pixel block 110-3, which are positioned on the same line in the second direction, have different shapes from each other. Therefore, the pixel array 100 may have a shape in which two kinds of pixel blocks 110 having different planar shapes are alternately disposed in the first direction D1 and the second direction D2. Through this design, the characteristic deterioration due to the fixed pattern noise may be prevented or reduced. For reference, the fixed pattern may noise occurs when a plurality of pixel blocks 110 have the same planar shape in the first direction D1 and the second direction D2.

The first pixel block 110-1 and the second pixel block 110-2 may be disposed adjacent to each other, and may have symmetrical shapes based on a boundary where the first pixel block 110-1 and the second pixel block 110-2 adjoin each other. A driving section 220-1 of the first pixel block 110-1 and a driving section 220-2 of the second pixel block 110-2 may have symmetrical shapes which share drains D of reset transistors Rx to which a reset voltage Vrst is applied. Based on the boundary where the first pixel block 110-1 and the second pixel block 110-2 adjoin each other, a first driving section 230-1 of the first pixel block 110-1 and a first driving section 230-2 of the second pixel block 110-2 may have shapes which face each other and share a first junction region 232 to which the reset voltage Vrst is applied. As the driving section 220-1 of the first pixel block 110-1 and the driving section 220-2 of the second pixel block 110-2 share the drains D of the reset transistors Rx, the sizes, in particular, channel areas, of pixel transistors may be effectively increased. Thus, the characteristic deterioration due to the temporal noise may be prevented or reduced. For reference, the temporal noise may occur due to a reduction in the size of a pixel transistor, in particular, a reduction in the area of a channel.

The third pixel block 110-3 and the fourth pixel block 110-4 may be disposed adjacent to each other, and may have symmetrical shapes based on a boundary where the third pixel block 110-3 and the fourth pixel block 110-4 adjoin each other. A driving section 220-3 of the third pixel block 110-3 and a driving section 220-4 of the fourth pixel block 110-4 may have symmetrical shapes which share drains D of driver transistors Dx to which a driver voltage Vdri is applied. In detail, based on the boundary where the third pixel block 110-3 and the fourth pixel block 110-4 adjoin each other, a second driving section 240-3 of the third pixel block 110-3 and a second driving section 240-4 of the fourth pixel block 110-4 may have shapes which face each other and share a third junction region 242 to which the driver voltage Vdri is applied. As the driving section 220-3 of the third pixel block 110-3 and the driving section 220-4 of the fourth pixel block 110-4 share the drains D of the driver transistors Dx, the sizes, in particular, channel areas, of pixel transistors may be effectively increased. Thus, the characteristic deterioration due to the temporal noise may be effectively prevented or reduced. For reference, the temporal noise may occur due to a reduction in the size of a pixel transistor, in particular, a reduction in the area of a channel.

The drain D of the reset transistors Rx which is shared by the first pixel block 110-1 and the second pixel block 110-2 and the drain D of the driver transistors Dx which is shared by the third pixel block 110-3 and the fourth pixel block 110-4 may be aligned with each other. For example, the drain D of the reset transistors Rx and the drain D of the driver transistors Dx which are shared by the pixel blocks 110-1 to 110-4 may be positioned on the same line in the second direction D2. Through this, the characteristic deterioration due to the fixed pattern noise may be effectively prevented or reduced. For reference, the temporal noise may occur due to a reduction in the size of a pixel transistor, in particular, a reduction in the area of a channel.

As is apparent from the above descriptions, in the image sensor in accordance with the embodiment, since the first pixel block 110-1 and the second pixel block 110-2 having shapes which share the drain D of the reset transistors Rx and the third pixel block 110-3 and the fourth pixel block 110-4 having shapes which share the drain D of the driver transistors Dx are alternately disposed in one direction, it is possible to prevent or reduce the noise generation and characteristic deterioration due to a shared pixel structure.

Figure 4:
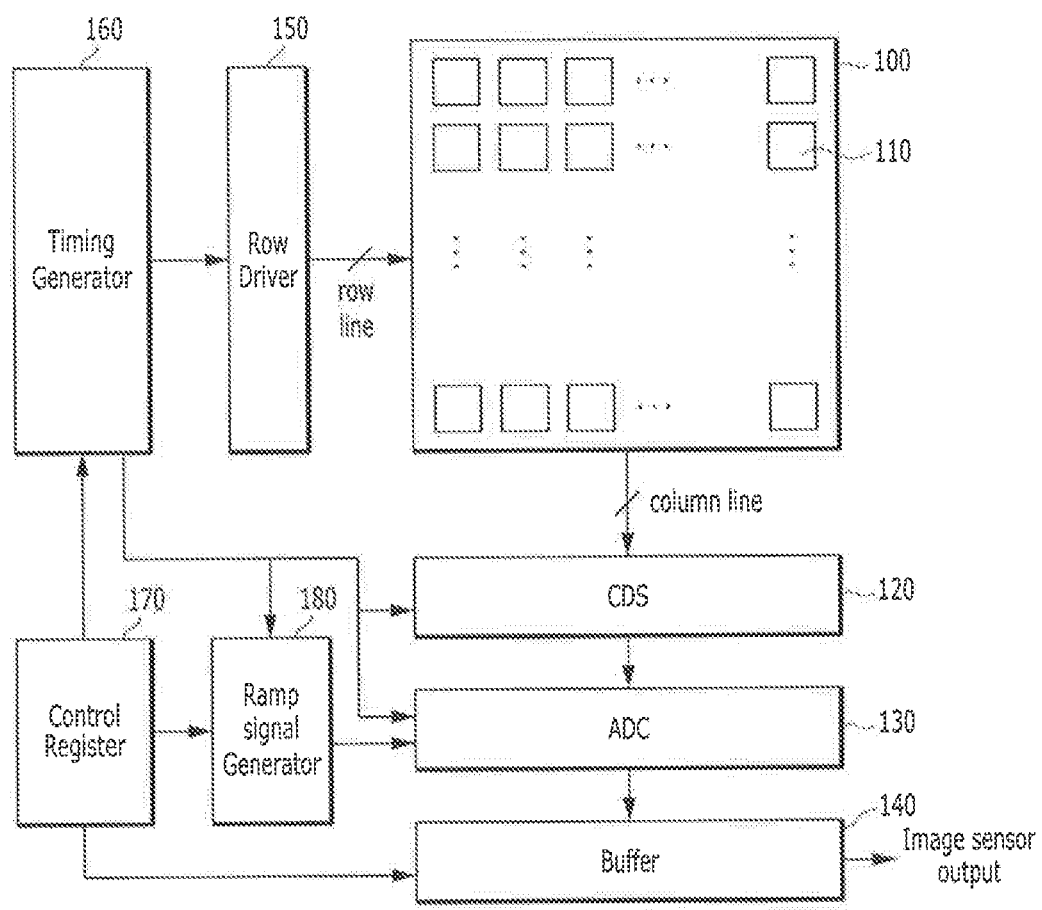
FIG. 4 is a block diagram schematically illustrating a representation of an example of an image sensor based on an embodiment of the disclosed technology.

FIG. 4 is a block diagram schematically illustrating a representation of an example of an image sensor based on an embodiment of the disclosed technology.

As shown in FIG. 4, the image sensor may include a pixel array 100, a correlated double sampling (CDS) 120, an analog-digital converter (ADC) 130, a buffer 140, a row driver 150, a timing generator 160, a control register 170, and a ramp signal generator 180. The plurality of pixel blocks 110 may be arranged in a matrix structure. Each of the plurality of pixel blocks 110 may have a shared pixel structure in which different pixels share a common floating diffusion region FD such as a 4-shared pixel structure illustrated in the example in FIG. 1.

The timing generator 160 generates one or more control signals for controlling the respective operations of the row driver 150, the correlated double sampling (CDS) 120, the analog-digital converter (ADC) 130 and the ramp signal generator 180. The control register 170 generates one or more control signals for controlling the respective operations of the ramp signal generator 180, the timing generator 160 and the buffer 140.

The row driver 150 is coupled to the pixel array 100 through a row line. The row driver 150 drives the pixel array 100 with the row line. For example, the row driver 150 may generate a select signal for selecting a particular row line among a plurality of row lines. The plurality of row lines are coupled with the plurality of pixel blocks 110, respectively. One row line is coupled to each of the plurality of pixel blocks 110.

The correlated double sampling 120 is coupled to the pixel array 150 through column lines. Each of the plurality of pixel blocks 110 senses incident light, and outputs an image reset signal and an image signal to the correlated double sampling 120 through a column line. The correlated double sampling 120 performs sampling for each of the image reset signal and the image signal that are received from the pixel array 100. The plurality of pixel blocks 110 are coupled to a plurality of column lines, respectively. One column line is coupled to each of the plurality of pixel blocks 110. The analog-digital converter 130 is coupled with the correlated double sampling 120 and the ramp signal generator 180. The analog-digital converter 130 is configured to receive a sampling signal and a ramp signal from the correlated double sampling 120 and the ramp signal generator 180, respectively, compare the ramp signal which is outputted from the ramp signal generator 180 with the sampling signal which is outputted from the correlated double sampling 120, and output a comparison signal. In some implementations, the analog-digital converter 130 is coupled to the timing generator 160 which provides a clock signal to the analog-digital converter 130. The analog-digital converter 130 counts a level transition time of the comparison signal using the clock signal which is provided from the timing generator 160, and outputs a count value to the buffer 140. In some implementations, the timing generator is further coupled to the ram signal generator 180 and the ramp signal generator 180 may operate under control of the timing generator 160.

The buffer 140 is coupled to the analog-digital converter 130 to receive digital signals from the analog-digital converter 130. In some implementations, the buffer 140 may include a memory (not shown) and a sense amplifier (not shown). The buffer 140 stores digital signals which are outputted from the analog-digital converter 130. In some implementations, the memory of the buffer 140 stores the count values that are counted by and provided from the analog-digital converter 130. The count values may be associated with the signals outputted from the plurality of pixel blocks 110. The buffer 140 is further configured to sense and amplify the stored digital signals, and outputs the amplified resultant signals. The sense amplifier of the buffer 140 is structured to sense and amplify the respective count values which are outputted from the memory.

The image sensor in accordance with the above-described embodiments can be used in various electronic devices or systems. Hereafter, a case in which the image sensor in accordance with the embodiments is applied to a camera will be described with reference to FIG. 5.

Figure 5:
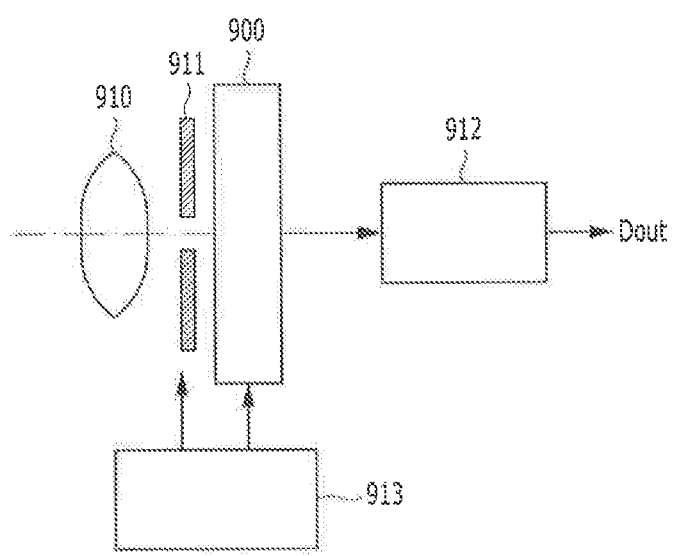
FIG. 5 is a diagram schematically illustrating a representation of an example of an electronic device including an image sensor based on an embodiment of the disclosed technology.

FIG. 5 is a diagram schematically illustrating a representation of an example of an electronic device including the image sensor based on an embodiment of the disclosed technology.

Referring to FIG. 5, the electronic device including the image sensor based on the embodiment of the disclosed technology may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 guides image light (incident light) from an object, to a pixel array of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or the like.

According to the embodiments, since a plurality of pixel blocks having shapes which share the drains of reset transistors and a plurality of pixel blocks having shapes which share the drains of driver transistors are alternately disposed in one direction, it is possible to prevent noise generation and characteristic deterioration due to a shared pixel structure.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An image sensor comprising:
a pixel array including a plurality of pixel blocks, each of the plurality of pixel blocks comprising:
 a light receiving section including a plurality of unit pixels which share a floating diffusion; and
 a driving section formed adjacent to the light receiving section, and including a reset transistor and a driver transistor, wherein the driver transistor is coupled to the floating diffusion to generate an output signal corresponding an amount of photocharges generated by the light receiving section,
wherein the plurality of pixel blocks includes a first pixel block and a second pixel block which are adjacent to each other in a first direction, and a third pixel block and a fourth pixel block which are adjacent to the first pixel block and the second pixel block, respectively, in a second direction intersecting with the first direction, and are further adjacent to each other in the first direction, and
wherein the reset transistor of the driving section of the first pixel block and the reset transistor of the driving section of the second pixel block share a drain between the reset transistors, and the driver transistor of the driving section of the third pixel block and the driver transistor of the driving section of the fourth pixel block share a drain between the driver transistors,
wherein the drain of the reset transistor which is shared by the first pixel block and the second pixel block and the drain of the driver transistor which is shared by the third pixel block and the fourth pixel block are positioned on a same line in the second direction.

2. The image sensor according to claim 1, in each of the plurality of pixel blocks, the driving section includes a first driving section which includes the reset transistor and a second driving section which is adjacent to the first driving section and includes the driver transistor, and further includes a pickup region which is formed between the first driving section and the second driving section.

3. The image sensor according to claim 1, wherein the drain of the reset transistor and the drain of the driver transistor are positioned at both ends, respectively, in each of the plurality of pixel blocks.

4. An image sensor comprising:
a pixel array including a plurality of pixel blocks, each of the plurality of pixel blocks comprising:
a light receiving section including a plurality of unit pixels which share a floating diffusion; and
a driving section formed adjacent to the light receiving section, and including a reset transistor and a driver transistor, wherein the driver transistor is coupled to the floating diffusion to generate an output signal corresponding an amount of photocharges generated by the light receiving section,
wherein the plurality of pixel blocks includes a first pixel block and a second pixel block which are adjacent to each other in a first direction, and a third pixel block and a fourth pixel block which are adjacent to the first pixel block and the second pixel block, respectively, in a second direction intersecting with the first direction, and are further adjacent to each other in the first direction, and
wherein the reset transistor of the driving section of the first pixel block and the reset transistor of the driving section of the second pixel block share a drain between the reset transistors, and the driver transistor of the driving section of the third pixel block and the driver transistor of the driving section of the fourth pixel block share a drain between the driver transistors, wherein the drain of the reset transistor which is shared by the first pixel block and the second pixel block is configured to receive a reset voltage, the drain of the driver transistor which is shared by the third pixel block and the fourth pixel block is configured to receive a driver voltage, and the reset voltage and the driver voltage are a power supply voltage or a positive voltage equal to or larger than the power supply voltage.

5. The image sensor according to claim 1,
wherein the plurality of pixel blocks include pixel blocks positioned on oblique lines crossing the first pixel block and having a same planar shape as the first pixel block, and
wherein the plurality of pixel blocks include pixel blocks positioned on oblique lines crossing the second pixel block and having a same planar shape as the second pixel block.

6. The image sensor according to claim 1, wherein a planar shape of the first pixel block is the same as a planar shape of the fourth pixel block, and a planar shape of the second pixel block is the same as a planar shape of the third pixel block.

7. The image sensor according to claim 1,
wherein a drain of the reset transistor is located further away from a center of a corresponding pixel block than a source of the reset transistor is, and
wherein a drain of the driver transistor is located further away from the center of the corresponding pixel block than a source of the driver transistor is.

8. An image sensor comprising:
a pixel array including a plurality of pixel blocks, each of the plurality of pixel blocks comprising:
a light receiving section including a plurality of unit pixels which share a floating diffusion;
a driving section formed adjacent to the light receiving section, and including a reset transistor and a driver transistor; and
an intercoupling section including a first conductive region which electrically couples the floating diffusion with the reset transistor and the driver transistor, and a second conductive region which has a shape symmetrical to the first conductive region based on the floating diffusion and is not electrically coupled to the reset transistor and the driver transistor,
wherein the plurality of pixel blocks include a first pixel block and a second pixel block which are adjacent to each other in a first direction, and a third pixel block and a fourth pixel block which are adjacent to the first pixel block and the second pixel block, respectively, in a second direction intersecting with the first direction, and are further adjacent to each other in the first direction, and
wherein the reset transistor of the driving section of the first pixel block and the reset transistor of the driving section of the second pixel block share a drain between the reset transistors, and the driver transistor of the driving section of the third pixel block and the driver transistor of the driving section of the fourth pixel block share a drain between the driver transistors.

9. The image sensor according to claim 8, in each of the plurality of pixel blocks, the driving section includes a first driving section which includes the reset transistor and a second driving section which is adjacent to the first driving section and includes the driver transistor, and further includes a pickup region which is formed between the first driving section and the second driving section.

10. The image sensor according to claim 9,
wherein the second driving section further includes a selection transistor, and
wherein the selection transistor is located closer to the floating diffusion than the driver transistor.

11. The image sensor according to claim 10, wherein a gate of the selection transistor is positioned on a same line as the floating diffusion.

12. The image sensor according to claim 8, wherein the first conductive region of the intercoupling section electrically couples the floating diffusion and a source of the reset transistor and electrically couples the floating diffusion and a gate of the driver transistor.

13. The image sensor according to claim 12, wherein a distance between the floating diffusion and the source of the reset transistor is substantially the same as a distance between the floating diffusion and the gate of the driver transistor.

14. The image sensor according to claim 8, wherein areas over which the intercoupling section overlaps with the respective unit pixels are substantially the same as one another.

15. The image sensor according to claim 8, wherein the drain of the reset transistor and the drain of the driver transistor are positioned at both ends, respectively, in each of the plurality of pixel blocks.

16. The image sensor according to claim 8, wherein the drain of the reset transistor which is shared by the first pixel block and the second pixel block and the drain of the driver transistor which is shared by the third pixel block and the fourth pixel block are positioned on a same line in the second direction.

17. The image sensor according to claim 8, wherein a reset voltage is applied to the drain of the reset transistor which is shared by the first pixel block and the second pixel block, a driver voltage is applied to the drain of the driver transistor which is shared by the third pixel block and the fourth pixel block, and the reset voltage and the driver voltage are a power supply voltage or a positive voltage equal to or larger than the power supply voltage.

18. The image sensor according to claim 8,
wherein the plurality of pixel blocks include pixel blocks positioned on oblique lines crossing the first pixel block and having a same planar shape as the first pixel block, and
wherein the plurality of pixel blocks include pixel blocks positioned on oblique lines crossing the second pixel block and having a same planar shape as the second pixel block.

19. The image sensor according to claim 8, wherein a planar shape of the first pixel block is the same as a planar shape of the fourth pixel block, and a planar shape of the second pixel block is the same as a planar shape of the third pixel block.

20. The image sensor according to claim 4, wherein a gate of the driver transistor is coupled to the floating diffusion.

\* \* \* \* \*